(12) United States Patent
Hong

(10) Patent No.: US 11,336,176 B1
(45) Date of Patent: May 17, 2022

(54) INTERNAL VOLTAGE GENERATION CIRCUIT

(71) Applicant: SK hynix Inc., Gyeonggi-do (KR)

(72) Inventor: Seok In Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/236,456

(22) Filed: Apr. 21, 2021

(30) Foreign Application Priority Data

Dec. 1, 2020 (KR) ........................ 10-2020-0165765

(51) Int. Cl.
| | | |
|---|---|---|
| *H02M 3/07* | (2006.01) | |
| *G11C 5/14* | (2006.01) | |
| *H02M 1/088* | (2006.01) | |

(52) U.S. Cl.
CPC ............... *H02M 3/07* (2013.01); *G11C 5/145* (2013.01); *G11C 5/147* (2013.01); *H02M 1/088* (2013.01); *H02M 3/077* (2021.05)

(58) Field of Classification Search
None
See application file for complete search history.

(56) References Cited

U.S. PATENT DOCUMENTS

| | | | | | |
|---|---|---|---|---|---|
| 5,159,543 | A * | 10/1992 | Yamawaki | .............. | H02M 1/36 363/60 |
| 6,472,926 | B2 * | 10/2002 | Taito | ..................... | H02M 3/073 327/536 |
| 6,483,728 | B1 * | 11/2002 | Johnson | ................ | H02M 3/073 363/60 |
| 7,253,676 | B2 * | 8/2007 | Fukuda | ................. | H02M 3/073 327/536 |
| 7,403,405 | B2 * | 7/2008 | Conte | ................... | H02M 3/073 363/59 |
| 7,605,639 | B2 * | 10/2009 | Gou | ........................ | H02M 3/07 327/534 |
| 7,876,585 | B2 * | 1/2011 | Wang | .................... | H02M 3/073 363/59 |
| 9,219,409 | B2 * | 12/2015 | Shao | ...................... | G11C 16/16 |
| 9,219,427 | B2 * | 12/2015 | Aebischer | ............. | H02H 9/046 |
| 10,277,209 | B2 * | 4/2019 | Hsieh | ................ | H03K 5/00006 |

FOREIGN PATENT DOCUMENTS

| | | |
|---|---|---|
| KR | 10-0900785 | 6/2009 |
| KR | 10-0927406 | 11/2009 |
| KR | 10-1313819 | 9/2013 |

* cited by examiner

*Primary Examiner* — Thomas J. Hiltunen
(74) *Attorney, Agent, or Firm* — IP & T Group LLP

(57) ABSTRACT

An internal voltage generation circuit may include an oscillation circuit, a signal generation circuit, and a pumping circuit. The oscillation circuit may generate an oscillation signal. The signal generation circuit may generate first and second pumping driving signals on the basis of the oscillation signal. The pumping circuit may generate a pumping voltage through a pumping operation on the basis of the first and second pumping driving signals.

17 Claims, 6 Drawing Sheets

INTERNAL VOLTAGE GENERATION CIRCUIT

CROSS-REFERENCES TO RELATED APPLICATION

The present application claims priority under 35 U.S.C. § 119(a) to Korean application number 10-2020-0165765, filed on Dec. 1, 2020, in the Korean Intellectual Property Office, which is incorporated herein by reference in its entirety.

BACKGROUND

1. Technical Field

Various embodiments generally relate to an internal voltage generation circuit, and, particularly, to an internal voltage generation circuit capable of generating a pumped voltage through a pumping operation.

2. Related Art

In general, a semiconductor apparatus including a volatile memory apparatus and a nonvolatile memory apparatus is provided with an internal voltage generation circuit for generating an internal voltage. The internal voltage generation circuit receives a power supply voltage and a ground supply voltage and generates internal voltages having various voltage levels. The internal voltage generation circuit may be designed according to a target voltage level. The internal voltage generation circuit includes components for generating the internal voltages through a pumping operation. The internal voltage generation circuit is able to generate an internal voltage having a voltage level higher than the power supply voltage and generate an internal voltage having a voltage level lower than the ground supply voltage through the pumping operation. Hereinafter, the internal voltage generated through the pumping operation will be referred to as a 'pumped voltage'.

The pumped voltage is generated through the pumping operation of the internal voltage generation circuit. In general, the pumping operation causes ripples of the pumped voltage. The ripple generated in the pumped voltage is noise in the pumped voltage. Furthermore, the noise in the pumped voltage serves as a factor that hinders a semiconductor apparatus from performing a normal operation.

SUMMARY

In accordance with an embodiment of the present disclosure, an internal voltage generation circuit may include: an internal voltage generation circuit comprising: an oscillation circuit configured to generate an oscillating signal on the basis of an enable signal; a signal generation circuit configured to generate, in a pump period, a first pumping driving signal and a second pumping driving signal to correspond to the oscillating signal, and to generate, in a maintenance period, the first pumping driving signal and the second pumping driving signal to include at least one of a first edge and a second edge of the oscillating signal; and a pumping circuit configured to generate a pumped voltage through a pumping operation on the basis of the first pumping driving signal and the second pumping driving signal.

In accordance with an embodiment of the present disclosure, an internal voltage generation circuit comprising: an oscillation circuit configured to generate an oscillating signal through an oscillation operation on the basis of an enable signal; a signal generation circuit configured to generate, in a pump period, a first pumping driving signal and a second pumping driving signal to correspond to the oscillating signal, and to generate, in a maintenance period, the first pumping driving signal and the second pumping driving signal to form an edge on the basis of a comparison signal; a pumping circuit configured to generate a pumped voltage through a pumping operation on the basis of the first pumping driving signal and the second pumping driving signal; and a comparison circuit configured to generate the comparison signal by comparing the pumped voltage with a reference voltage corresponding to a target voltage of the pumped voltage.

In accordance with an embodiment of the present disclosure, a method of pumping a voltage, the method comprising: generating a driving signal; and performing a single pumping operation to pump the voltage whenever the driving signal transitions, wherein the generating of the driving signal includes: generating the driving signal that oscillates until the pumped voltage reaches a target voltage, and generating, after the pumped voltage reaches the target voltage, the driving signal that transitions whenever the pumped voltage becomes lower than the target voltage.

DETAILED DESCRIPTION

The present description of the present disclosure provides structural and functional details directed to various embodiments. The scope of the invention, however, is not limited to or by any of the disclosed embodiments nor to any particular detail provided herein. That is, those skilled in the art will understand in view of the present disclosure that any embodiment may be modified in various ways and may have various forms. Accordingly, the invention encompasses all such variations that fall within the scope of the claims including their equivalents. Furthermore, an embodiment does not necessarily include all stated objects or effects nor include only such objects and effects. Accordingly, the scope of the invention is not limited thereby.

Throughout the specification, reference to "an embodiment" or the like is not necessarily to only one embodiment, and different references to any such phrase is not necessarily to the same embodiment(s). The term "embodiments" when used herein does not necessarily refer to all embodiments.

Terms, such as "first" and "second", are used to distinguish one element from another element that otherwise have the same or similar names. A first element in one instance may be named a second element in another instance without indicating any substantive change in the element itself.

The singular is intended to include the plural, unless clearly expressed otherwise or it is clear from the context that only one is intended. Open-ended terms such as "include" or "have" should be understood as indicating the existence of stated characteristics, numbers, steps, operations, elements, parts, or combination thereof, but not excluding the possibility that one or more other characteristics, numbers, steps, operations, elements, parts, or combination thereof are present or may be added.

In each of steps, symbols (e.g., a, b, and c) are used for convenience of a description, not necessarily to indicate any particular order of steps or operations. Consistent with the teachings herein, steps/operations may be performed in any suitable order, unless a specific order is clearly described or such order is indicated by the context. In some cases, two or more steps/operations may be performed substantially at the same time.

All the terms used herein, including technological or scientific terms, have the same meanings as typically understood by those skilled in the art, unless otherwise defined. Terms defined in commonly used dictionaries should be construed in the context of the related technology and should not be construed as ideal or in an excessively formal way, unless clearly defined in the application.

Various embodiments are directed to providing an internal voltage generation circuit capable of generating a pumped voltage even through a minimized pumping operation.

An embodiment of the present disclosure has an effect of minimizing a pumping operation, thereby minimizing ripples generated in a pumped voltage.

Figure 1:
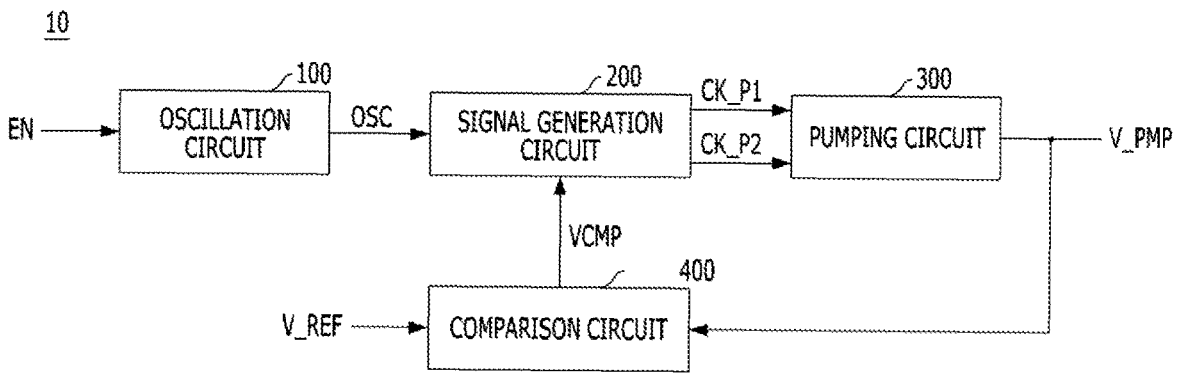
FIG. 1 is a block diagram illustrating a configuration of an internal voltage generation circuit in accordance with an embodiment of the present disclosure.

FIG. 1 is a block diagram illustrating a configuration of an internal voltage generation circuit 10 in accordance with an embodiment of the present disclosure.

Referring to FIG. 1, the internal voltage generation circuit may include an oscillation circuit 100, a signal generation circuit 200, and a pumping circuit 300.

The oscillation circuit 100 may be configured to generate an oscillating signal OSC on the basis of an enable signal EN. The enable signal EN may be a signal for enabling or disabling the internal voltage generation circuit. The oscillation circuit 100 may generate the oscillating signal OSC through an oscillation operation. The oscillating signal OSC may be a clock signal that is toggled at a predetermined frequency. The oscillating signal OSC may include a rising edge corresponding to a first edge and a falling edge corresponding to a second edge.

The signal generation circuit 200 may be configured to generate, in a pump period, a first pumping driving signal CK_P1 and a second pumping driving signal CK_P2 corresponding to the oscillating signal OSC. The first pumping driving signal CK_P1 may be a signal corresponding to the rising edge of the oscillating signal OSC, and the second pumping driving signal CK_P2 may be a signal corresponding to the falling edge of the oscillating signal OSC. Furthermore, the pump period may be a period in which the pumping operation is performed in order to increase a voltage level of a pumped voltage V_PMP to a preset target voltage level.

Furthermore, the signal generation circuit 200 may be configured to generate, in a maintenance period, the first pumping driving signal CK_P1 and the second pumping driving signal CK_P2 each including at least one edge of the rising edge and the falling edge of the oscillating signal OSC. The maintenance period may be an operation period after the pump period. In other words, the maintenance period may be a period in which, when the voltage level of the pumped voltage V_PMP is lower than the preset target voltage level after the pump period, a pumping operation is performed in order to increase the voltage level of the pumped voltage V_PMP to the preset voltage level again. As will be described again below with reference to FIG. 5, in the maintenance period, the first pumping driving signal CK_P1 may include an edge that transitions to a logic 'high' in response to the rising edge of the oscillating signal OSC, and the second pumping driving signal CK_P2 may include an edge that transitions to a logic 'low' in response to the rising edge of the oscillating signal OSC. Alternately, in the maintenance period, the second pumping driving signal CK_P2 may include an edge that transitions to a logic 'high' in response to the falling edge of the oscillating signal OSC, and the first pumping driving signal CK_P1 may include an edge that transitions to a logic 'low' in response to the falling edge of the oscillating signal OSC.

The pumping circuit 300 may be configured to generate the pumped voltage V_PMP through the pumping operation on the basis of the first pumping driving signal CK_P1 and the second pumping driving signal CK_P2. The pumping circuit 300 may simultaneously receive the first pumping driving signal CK_P1 and the second pumping driving signal CK_P2 and perform the pumping operation.

In the pump period, the internal voltage generation circuit in accordance with an embodiment of the present disclosure may generate the first pumping driving signal CK_P1 and the second pumping driving signal CK_P2 corresponding to the oscillating signal OSC and perform the pumping operation. Furthermore, in in the maintenance period, the internal voltage generation circuit may generate the first pumping driving signal CK_P1 and the second pumping driving signal CK_P2 each including at least one edge of the rising edge and the falling edge of the oscillating signal OSC and perform the pumping operation.

In this connection, the internal voltage generation circuit may perform a single pumping operation on the basis of the first pumping driving signal CK_P1 and the second pumping driving signal CK_P2 in the maintenance period. Hereinafter, for convenience of description, the single pumping operation will be defined as a 'unit pumping operation'. The unit pumping operation may cause, in the pumped voltage V_PMP, ripples as many as caused by the single pumping operation. In other words, the internal voltage generation circuit in accordance with an embodiment of the present disclosure is able to minimize ripples generated in the pumped voltage V_PMP through the unit pumping operation.

Meanwhile, the internal voltage generation circuit in accordance with an embodiment of the present disclosure may include a comparison circuit 400.

The comparison circuit 400 may be configured to generate a comparison signal VCMP by comparing a reference voltage V_REF corresponding to the target voltage of the pumped voltage V_PMP with the pumped voltage V_PMP. Therefore, when the pumped voltage V_PMP has a lower voltage level than the reference voltage V_REF, the comparison circuit 400 may generate the comparison signal VCMP for performing the pumping operation. When the pumped voltage V_PMP has a higher voltage level than the reference voltage V_REF, the comparison circuit 400 may generate the comparison signal VCMP for stopping the pumping operation.

Figure 2:
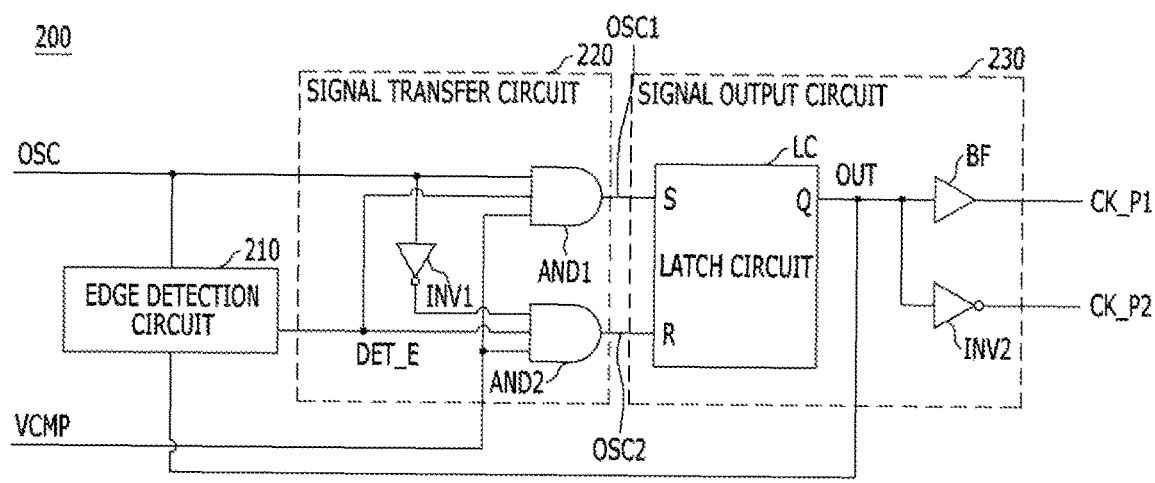
FIG. 2 is a diagram illustrating a configuration of a signal generation circuit in FIG. 1.

FIG. 2 is a diagram illustrating the configuration of the signal generation circuit 200 in FIG. 1.

Referring to FIG. 2, the signal generation circuit 200 may include an edge detection circuit 210, a signal transfer circuit 220, and a signal output circuit 230.

The edge detection circuit 210 may be configured to generate an edge detection signal DET_E by detecting the rising edge and the falling edge of the oscillating signal OSC in the maintenance period. The edge detection circuit 210 may generate the edge detection signal DET_E by comparing a logic level of an output signal OUT of a latch circuit LC to be described below with a logic level of the oscillating signal OSC. The edge detection signal DET_E will be described in detail with reference to FIG. 5.

The signal transfer circuit 220 may be configured to transfer the oscillating signal OSC as a first oscillating signal OSC1 and a second oscillating signal OSC2 on the basis of the edge detection signal DET_E and the comparison signal VCMP. The signal transfer circuit 220 may output the oscillating signal OSC as the first oscillating signal OSC1 and the second oscillating signal OSC2 in the pump period. Furthermore, the signal transfer circuit 220 may transfer at least one of the rising edge and the falling edge of the oscillating signal OSC as the first oscillating signal OSC1 and the second oscillating signal OSC2 in the maintenance period. In an embodiment, the signal transfer circuit 220 may include a first inverter INV1, a first AND gate AND1, and a second AND gate AND2.

The first inverter INV1 may receive and invert the oscillating signal OSC and output the inverted signal. The first AND gate AND1 may receive the oscillating signal OSC, the edge detection signal DET_E, and the comparison signal VCMP and output the first oscillating signal OSC1. The second AND gate AND2 may receive an output signal of the first inverter INV1, the edge detection signal DET_E, and the comparison signal VCMP and output the second oscillating signal OSC2.

The signal output circuit 230 may be configured to generate the first pumping driving signal CK_P1 and the second pumping driving signal CK_P2 on the basis of the first oscillating signal OSC1 and the second oscillating signal OSC2. In an embodiment, the signal output circuit 230 may include the latch circuit LC, a buffer circuit BF, and a second inverter INV2.

The latch circuit LC may be configured to receive the first oscillating signal OSC1 and the second oscillating signal OSC2 and perform a latching operation. The latch circuit LC may be implemented as an SR latch including, for example, a first input terminal S, a second input terminal R, and an output terminal Q. That is, the latch circuit LC may receive the first oscillating signal OSC1 through the first input terminal S and perform a set operation and may receive the second oscillating signal OSC2 through the second input terminal R and perform a reset operation. Accordingly, the latch circuit LC may output and substantially maintain the output signal OUT having, for example, a logic 'high' through the set operation, and may output and substantially maintain the output signal OUT having, for example, a logic 'low' through the reset operation.

The buffer circuit BF may be an output circuit for receiving the output signal OUT of the latch circuit LC and outputting the first pumping driving signal CK_P1. The second inverter INV2 may be an output circuit for inverting the output signal OUT of the latch circuit LC and outputting the second pumping driving signal CK_P2. The first pumping driving signal CK_P1 and the second pumping driving signal CK_P2 output from the signal output circuit 230 will be described in more detail again with reference to FIG. 5.

Figure 3:
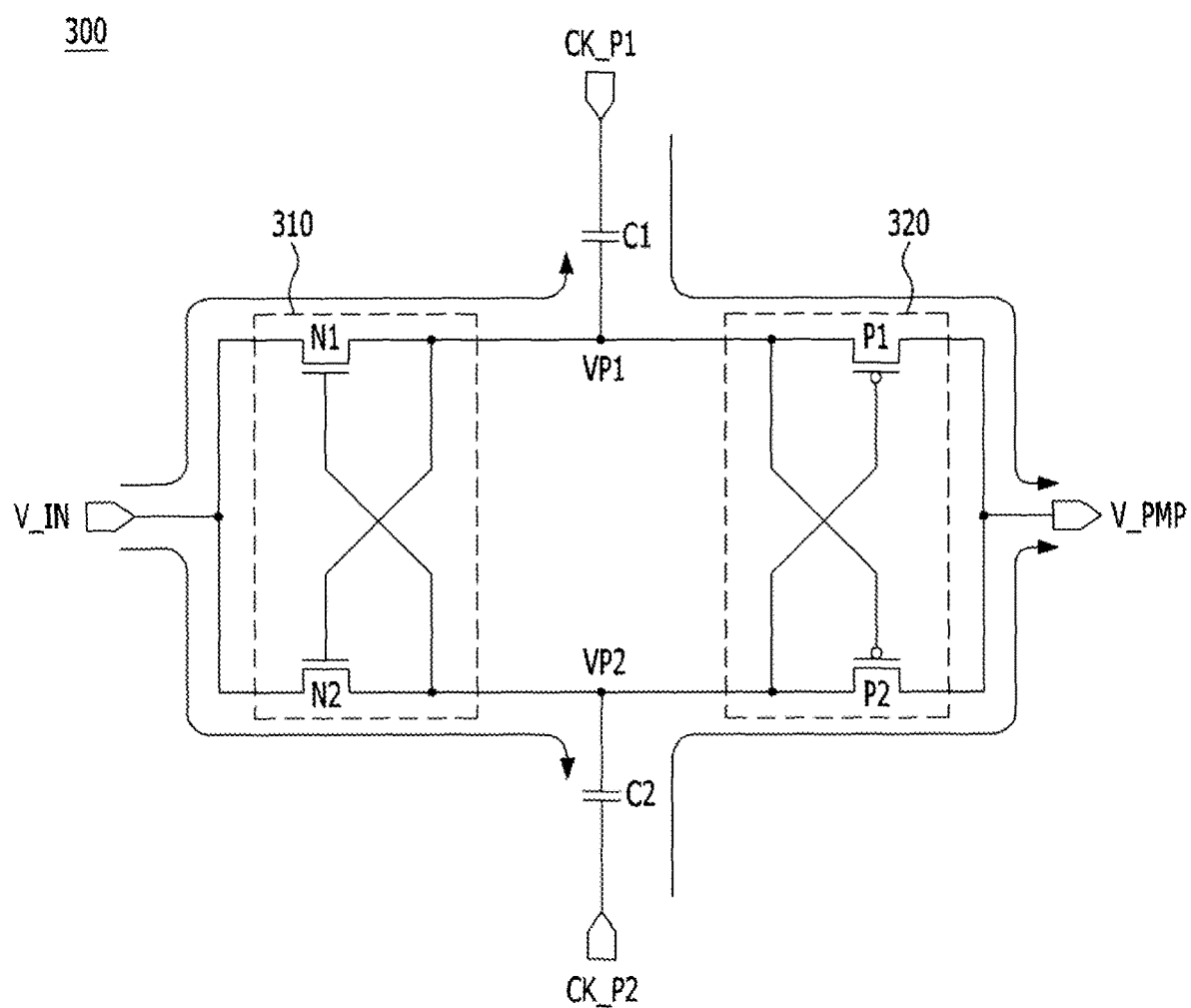
FIG. 3 is a circuit diagram illustrating a configuration of a pumping circuit in FIG. 1.

FIG. 3 is a circuit diagram illustrating the configuration of the pumping circuit 300 in FIG. 1.

Referring to FIG. 3, the pumping circuit 300 may include a charge/discharge circuit 310 and a pumping output circuit 320.

The charge/discharge circuit 310 may be configured to charge and discharge a first charge/discharge node VP1 on the basis of the first pumping driving signal CK_P1, and charge and discharge a second charge/discharge node VP2 on the basis of the second pumping driving signal CK_P2. In an embodiment, the charge/discharge circuit 310 may include a first NMOS transistor N1 and a second NMOS transistor N2.

The first NMOS transistor N1 may have a drain terminal and a source terminal connected between a voltage input terminal V_IN and the first charge/discharge node VP1, and a gate terminal connected to the second charge/discharge node VP2. The second NMOS transistor N2 may have a drain terminal and a source terminal connected between the voltage input terminal V_IN and the second charge/discharge node VP2, and a gate terminal connected to the first charge/discharge node VP1. The voltage input terminal V_IN may receive a voltage supplied for the pumping operation. The first charge/discharge node VP1 may be connected to a first capacitor C1 that receives the first pumping driving signal CK_P1, and the second charge/discharge node VP2 may be connected to a second capacitor C2 that receives the second pumping driving signal CK_P2. Accordingly, the first charge/discharge node VP1 may be charged and discharged on the basis of the first pumping driving signal CK_P1, and the second charge/discharge node VP2 may be charged and discharged on the basis of the second pumping driving signal CK_P2.

The pumping output circuit 320 may be configured to output the charge, which has been stored in the first charge/discharge node VP1 on the basis of the first pumping driving signal CK_P1, as the pumped voltage V_PMP, and to output the charge, which has been stored in the second charge/discharge node VP2 on the basis of the second pumping driving signal CK_P2, as the pumped voltage V_PMP. In an embodiment, the pumping output circuit 320 may include a first PMOS transistor P1 and a second PMOS transistor P2.

The first PMOS transistor P1 may have a source terminal and a drain terminal connected between the first charge/discharge node VP1 and an output terminal of the pumped voltage V_PMP, and a gate terminal connected to the second charge/discharge node VP2. The second PMOS transistor P2 may have a source terminal and a drain terminal connected between the second charge/discharge node VP2 and the output terminal of the pumped voltage V_PMP, and a gate terminal connected to the first charge/discharge node VP1.

As described above, the first charge/discharge node VP1 may be charged and discharged on the basis of the first pumping driving signal CK_P1, and the second charge/discharge node VP2 may be charged and discharged on the basis of the second pumping driving signal CK_P2. The first PMOS transistor P1 may be turned on and off according to a voltage level of the second charge/discharge node VP2, and the second PMOS transistor P2 may be turned on and off according to a voltage level of the first charge/discharge node VP1. Accordingly, the pumping output circuit 320 may output the charge, which has been stored in the second charge/discharge node VP2 on the basis of the first pumping driving signal CK_P1, as the pumped voltage V_PMP, and output the charge, which has been stored in the first charge/ discharge node VP1 on the basis of the second pumping driving signal CK_P2, as the pumped voltage V_PMP.

Figure 4:
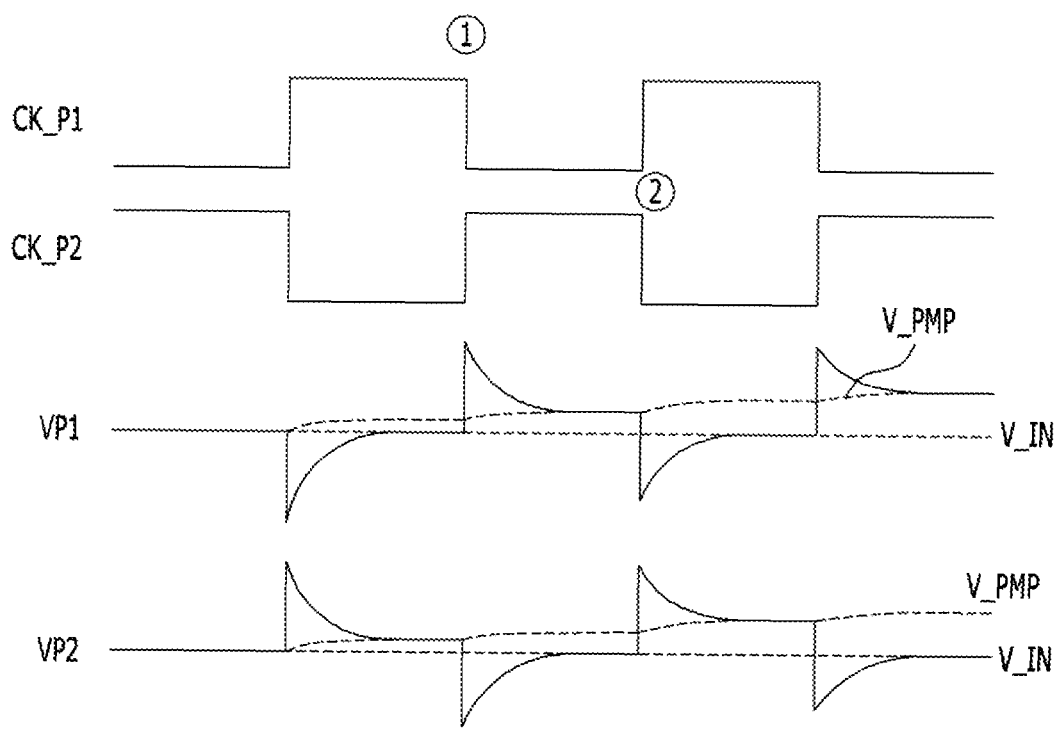
FIG. 4 is a diagram illustrating a pumping operation of the pumping circuit in FIG. 3.

FIG. 4 is a diagram illustrating the pumping operation of the pumping circuit 300 in FIG. 3.

FIG. 4 illustrates signal waveforms corresponding to the first pumping driving signal CK_P1, the second pumping driving signal CK_P2, the first charge/discharge node VP1, the second charge/discharge node VP2, the pumped voltage V_PMP, and the voltage input terminal V_IN, respectively.

Referring to FIG. 3 and FIG. 4, the charge/discharge circuit 310 may charge the first charge/discharge node VP1 at the time point ① at which the first pumping driving signal CK_P1 transitions from a logic 'high' to a logic 'low'. At this time, the pumping output circuit 320 may output the charge, which has been stored in the first charge/discharge node VP1, as the pumped voltage V_PMP at the time point ① at which the second pumping driving signal CK_P2 transitions from a logic 'low' to a logic 'high'. That is, the pumping circuit 300 may perform the unit pumping operation at the time point ① at which the first pumping driving signal CK_P1 transitions from a logic 'high' to a logic 'low' and the second pumping driving signal CK_P2 transitions from a logic 'low' to a logic 'high'. The time point ① at which the first pumping driving signal CK_P1 transitions from a logic 'high' to a logic 'low' may correspond to the falling edge of the oscillating signal OSC. Accordingly, the pumping circuit 300 may perform the unit pumping operation on the basis of the falling edge of the oscillating signal OSC.

Meanwhile, the charge/discharge circuit 310 may charge the second charge/discharge node VP2 at the time point ② at which the second pumping driving signal CK_P2 transitions from a logic 'high' to a logic 'low'. At this time, the pumping output circuit 320 may output the charge, which has been stored in the second charge/discharge node VP2, as the pumped voltage V_PMP at the time point ② at which the first pumping driving signal CK_P1 transitions from a logic 'low' to a logic 'high'. That is, the pumping circuit 300 may perform the unit pumping operation at the time point ② at which the second pumping driving signal CK_P2 transitions from a logic 'high' to a logic 'low' and the first pumping driving signal CK_P1 transitions from a logic 'low' to a logic 'high'. The time point ② at which the first pumping driving signal CK_P1 transitions from a logic 'low' to a logic 'high' may correspond to the rising edge of the oscillating signal OSC. Accordingly, the pumping circuit 300 may perform the unit pumping operation on the basis of the rising edge of the oscillating signal OSC.

The internal voltage generation circuit in accordance with an embodiment of the present disclosure is able to perform the unit pumping operation including a single pumping operation on the basis of the rising edge or the falling edge of the oscillating signal OSC.

Figure 5:
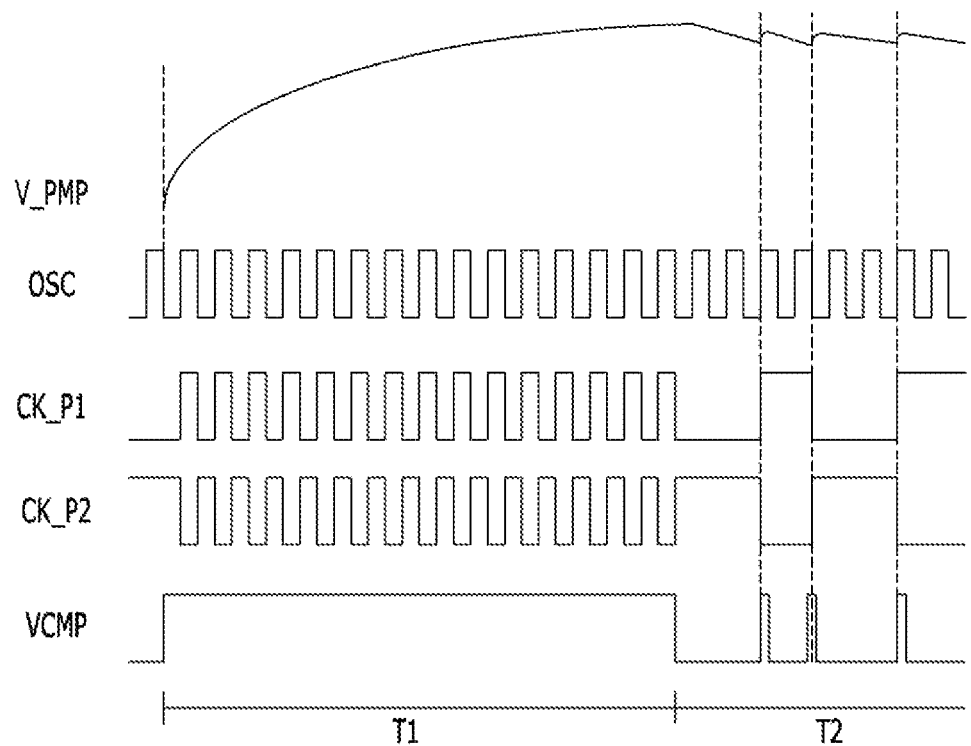
FIG. 5 is a diagram illustrating an overall pumping operation of the internal voltage generation circuit in FIG. 1.

FIG. 5 is a diagram illustrating an overall pumping operation of the internal voltage generation circuit in FIG. 1. FIG. 5 illustrates signal waveforms corresponding to the pumped voltage V_PMP, the oscillating signal OSC, the first pumping driving signal CK_P1, the second pumping driving signal CK_P2, and the comparison signal VCMP, respectively.

Hereinafter, for convenience of description, the overall pumping operation of the internal voltage generation circuit will be described with reference to FIG. 1, FIG. 2, and FIG. 5. Hereinafter, the pump period will be referred to as 'T1' and the maintenance period will be referred to as 'T2'.

First, in the pump period 'T1', the signal transfer circuit 220 of the signal generation circuit 200 in FIG. 2 may generate the first oscillating signal OSC1 and the second oscillating signal OSC2 corresponding to the oscillating signal OSC. The signal output circuit 230 may generate the first pumping driving signal CK_P1 and the second pumping driving signal CK_P2 on the basis of the first oscillating signal OSC1 and the second oscillating signal OSC2. Subsequently, the pumping circuit 300 in FIG. 1 may generate the pumped voltage V_PMP on the basis of the first pumping driving signal CK_P1 and the second pumping driving signal CK_P2. Accordingly, the internal voltage generation circuit may generate the pumped voltage V_PMP through the pumping operation corresponding to the oscillating signal OSC that toggles in the pump period 'T1'.

Next, at an initial stage of the maintenance period T2 after the pump period 'T1', the pumped voltage V_PMP may be higher than the reference voltage V_REF corresponding to the target voltage level. Accordingly, the comparison signal VCMP may have a logic 'low'. Then, when the pumped voltage V_PMP becomes lower than the reference voltage V_REF, the comparison signal VCMP may be enabled to a logic 'high'.

At this time, the edge detection circuit 210 in FIG. 2 may generate the edge detection signal DET_E by comparing the logic level of the output signal OUT of the latch circuit LC with the logic level of the oscillating signal OSC. The edge detection signal DET_E may be enabled to a logic 'high' when both the logic levels of the output signal OUT of the latch circuit LC and the oscillating signal OSC are logic 'low' as a result of comparing the logic level of the output signal OUT with the logic level of the oscillating signal OSC. Accordingly, the signal transfer circuit 220 may transfer the rising edge of the oscillating signal OSC as the first oscillating signal OSC1 on the basis of the logic 'high' comparison signal VCMP and the logic 'high' edge detection signal DET_E. Furthermore, the signal transfer circuit 220 may invert the rising edge of the oscillating signal OSC and transfer the inverted oscillating signal OSC as the second oscillating signal OSC2.

Subsequently, the latch circuit LC may perform the set operation on the basis of the first oscillating signal OSC1. The latch circuit LC may output and substantially maintain the output signal OUT having a logic 'high' on the basis of the first oscillating signal OSC1. The output signal OUT of the latch circuit LC may correspond to the first pumping driving signal CK_P1, and a signal obtained by inverting the output signal OUT of the latch circuit LC may correspond to the second pumping driving signal CK_P2. As a consequence, the first pumping driving signal CK_P1 may include an edge that transitions to a logic 'high' in response to the rising edge of the oscillating signal OSC, and substantially maintain a logic 'high'. Furthermore, the second pumping driving signal CK_P2 may include an edge that transitions to a logic 'low' in response to the rising edge of the oscillating signal OSC, and substantially maintain a logic 'low'.

Subsequently, the pumping circuit 300 in FIG. 1 may perform the unit pumping operation on the basis of the first pumping driving signal CK_P1 and the second pumping driving signal CK_P2. As described above, the first pumping driving signal CK_P1 and the second pumping driving signal CK_P2 may be signals corresponding to the rising edge of the oscillating signal OSC. That is, the pumping circuit 300 may perform the unit pumping operation on the basis of the rising edge of the oscillating signal OSC.

Furthermore, the voltage level of the pumped voltage V_PMP may be higher than that of the reference voltage V_REF through the unit pumping operation. Accordingly, the comparison signal VCMP may be disabled to a logic 'low'. Then, when the voltage level of the pumped voltage V_PMP becomes lower than the reference voltage V_REF again, the comparison signal VCMP may be enabled to a logic 'high' again.

As described above, the edge detection signal DET_E may be enabled to a logic 'high' when both the voltage levels of the output signal OUT of the latch circuit LC and the oscillating signal OSC are logic 'high' as a result of comparing the logic level of the output signal OUT with the logic level of the oscillating signal OSC. Accordingly, the signal transfer circuit 220 may transfer the falling edge of the oscillating signal OSC as the first oscillating signal OSC1. Furthermore, the signal transfer circuit 220 may invert the falling edge of the oscillating signal OSC and transfer the inverted oscillating signal OSC as the second oscillating signal OSC2. Subsequently, the latch circuit LC may perform the reset operation on the basis of the second oscillating signal OSC2 corresponding to the falling edge of the oscillating signal OSC. That is, the latch circuit LC may output and substantially maintain the output signal OUT having a logic 'low' on the basis of the second oscillating signal OSC2. As a consequence, the first pumping driving signal CK_P1 may include an edge that transitions to a logic 'low' in response to the falling edge of the oscillating signal OSC, and substantially maintain a logic 'low'. Furthermore, the second pumping driving signal CK_P2 may include an edge that transitions to a logic 'high' in response to the falling edge of the oscillating signal OSC, and substantially maintain a logic 'high'.

Subsequently, the pumping circuit 300 in FIG. 1 may perform the unit pumping operation on the basis of the first pumping driving signal CK_P1 and the second pumping driving signal CK_P2 corresponding to the falling edge of the oscillating signal OSC. That is, the pumping circuit 300 may perform the unit pumping operation on the basis of the falling edge of the oscillating signal OSC. Then, the voltage level of the pumped voltage V_PMP may become higher than that of the reference voltage V_REF through the unit pumping operation.

The internal voltage generation circuit in accordance with an embodiment of the present disclosure is able to generate the pumped voltage V_PMP through the unit pumping operation corresponding to the rising or falling edge of the oscillating signal OSC. Accordingly, only a minimum ripple may be caused in the pumped voltage V_PMP due to the unit pumping operation as a single pumping operation.

Figure 6:
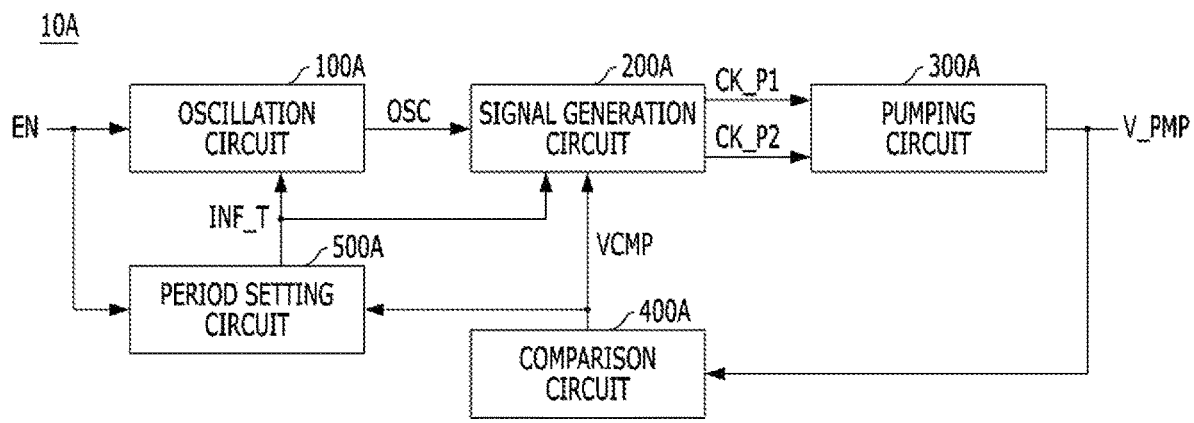
FIG. 6 is a block diagram illustrating a configuration of an internal voltage generation circuit in accordance with an embodiment of the present disclosure.

FIG. 6 is a block diagram illustrating a configuration of an internal voltage generation circuit 10A in accordance with an embodiment of the present disclosure.

Referring to FIG. 6, the internal voltage generation circuit may include an oscillation circuit 100A, a signal generation circuit 200A, a pumping circuit 300A, and a comparison circuit 400A.

The oscillation circuit 100A may be configured to generate an oscillating signal OSC through an oscillation operation on the basis of an enable signal EN. The enable signal EN may be a signal for enabling the internal voltage generation circuit. The oscillation operation of the oscillation circuit 100A may be controlled on the basis of operation period information INF_T. As will be described again below, the operation period information INF_T may be a signal corresponding to a pump period and a maintenance period. Therefore, the oscillation operation of the oscillation circuit 100A may be enabled in the pump period on the basis of the operation period information INF_T. Furthermore, the oscillation operation of the oscillation circuit 100A may be disabled in the maintenance period on the basis of the operation period information INF_T.

The signal generation circuit 200A may be configured to generate, in the pump period, a first pumping driving signal CK_P1 and a second pumping driving signal CK_P2 corresponding to the oscillating signal OSC. The first pumping driving signal CK_P1 may be a signal corresponding to a rising edge of the oscillating signal OSC, and the second pumping driving signal CK_P2 may be a signal corresponding to a falling edge of the oscillating signal OSC.

Furthermore, the signal generation circuit 200A may be configured to generate, in the maintenance period, the first pumping driving signal CK_P1 and the second pumping driving signal CK_P2 each including an edge formed on the basis of a comparison signal VCMP. As will be described again below with reference to FIG. 8, the first pumping driving signal CK_P1 and the second pumping driving signal CK_P2 each may include an edge having a logic level that transitions on the basis of the comparison signal VCMP in the maintenance period.

The pumping circuit 300A may be configured to generate a pumped voltage V_PMP through a pumping operation on the basis of the first pumping driving signal CK_P1 and the second pumping driving signal CK_P2. The pumping circuit 300A may simultaneously receive the first pumping driving signal CK_P1 and the second pumping driving signal CK_P2 and perform the pumping operation. The pumping circuit 300A may perform the unit pumping operation on the basis of the first pumping driving signal CK_P1 and the second pumping driving signal CK_P2 generated in the maintenance period.

The comparison circuit 400A may be configured to generate the comparison signal VCMP by comparing a reference voltage V_REF corresponding to a target voltage of the pumped voltage V_PMP with the pumped voltage V_PMP. Therefore, when the pumped voltage V_PMP has a lower voltage level than that of the reference voltage V_REF, the comparison circuit 400A may generate the comparison signal VCMP for performing the pumping operation. When the pumped voltage V_PMP has a higher voltage level than that of the reference voltage V_REF, the comparison circuit 400A may generate the comparison signal VCMP for stopping the pumping operation.

In the pump period, the internal voltage generation circuit in accordance with an embodiment of the present disclosure is able to generate the first pumping driving signal CK_P1 and the second pumping driving signal CK_P2 corresponding to the oscillating signal OSC and perform the pumping operation. Furthermore, in the maintenance period, the internal voltage generation circuit is able to generate the first pumping driving signal CK_P1 and the second pumping driving signal CK_P2 each including an edge formed on the basis of the comparison signal VCMP. In addition, the internal voltage generation circuit is able to disable the oscillation operation of the oscillation circuit 100A in the maintenance period, thereby minimizing power consumed during the oscillation operation. Moreover, the internal voltage generation circuit is able to perform the unit pumping operation in the maintenance period, thereby minimizing ripples generated in the pumped voltage V_PMP.

Meanwhile, the internal voltage generation circuit in accordance with an embodiment of the present disclosure may further include a period setting circuit 500A.

The period setting circuit 500A may be configured to generate the operation period information INF_T corresponding to the pump period and the maintenance period on the basis of the enable signal EN and the comparison signal VCMP. For reference, in the operation period information INF_T, the start time point of the pump period T1 may be defined on the basis of the enable signal EN. The comparison signal VCMP will be described in more detail with reference to FIG. 8, but the comparison signal VCMP may have a logic 'high' in the pump period and then may transition to a logic 'low'. Accordingly, the operation period information INF_T may define the start time point of the maintenance period T2 on the basis of the time point at which the comparison signal VCMP transitions to a logic 'low'.

As described above, the operation period information INF_T may be provided to the oscillation circuit 100A to control the oscillation operation thereof. Furthermore, the operation period information INF_T may be provided to the signal generation circuit 200A to select a signal used for generating the first pumping driving signal CK_P1 and the second pumping driving signal CK_P2. The selection of the signal will be described in more detail with reference to FIG. 7.

Figure 7:
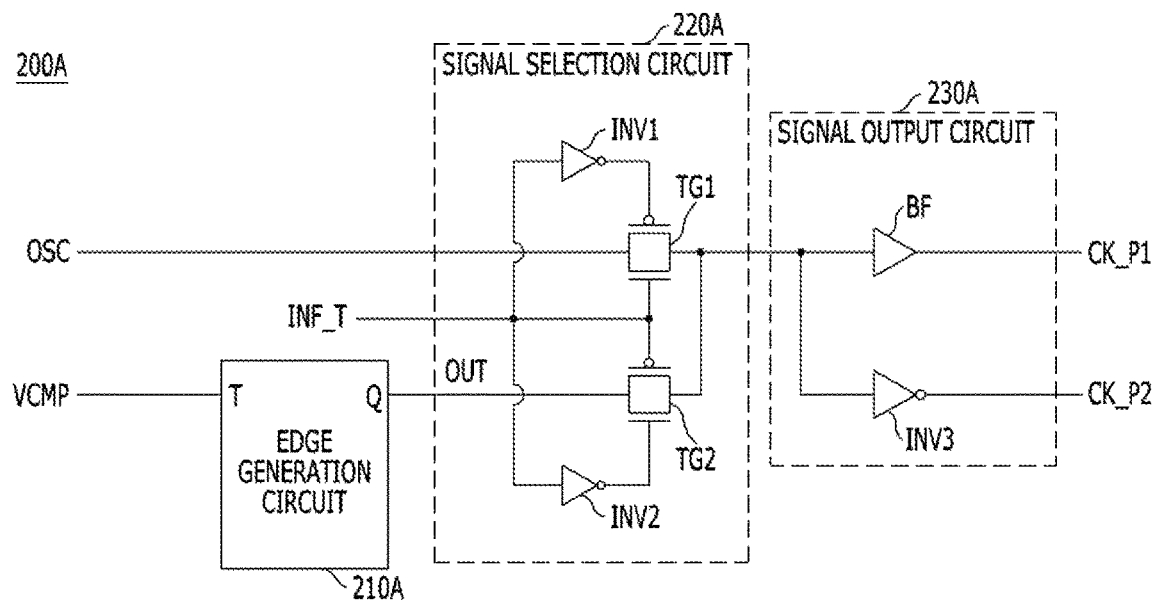
FIG. 7 is a diagram illustrating a configuration of a signal generation circuit in FIG. 6.

FIG. 7 is a diagram illustrating the configuration of the signal generation circuit 200A in FIG. 6.

Referring to FIG. 7, the signal generation circuit 200A may include an edge generation circuit 210A, a signal selection circuit 220A, and a signal output circuit 230A.

The edge generation circuit 210A may be configured to generate edges in an output signal OUT on the basis of the comparison signal VCMP. The edge generation circuit 210A may be implemented by, for example, a T flip-flop including an input terminal T and an output terminal Q. That is, the edge generation circuit 210A may sequentially generate an edge, which transitions to a logic 'high', and an edge, which transitions to a logic 'low', in the output signal OUT of the output terminal Q on the basis of the comparison signal VCMP input to the input terminal T. Therefore, the output signal OUT of the edge generation circuit 210A may include the edge that transitions to a logic 'high', and may substantially maintain a logic 'high'. Furthermore, the output signal OUT of the edge generation circuit 210A may include the edge that transitions to a logic 'low', and may substantially maintain a logic 'low'.

The signal selection circuit 220A may be configured to output the oscillating signal OSC or the output signal OUT of the edge generation circuit 210A on the basis of the operation period information INF_T. In an embodiment, the signal selection circuit 220A may include a first transfer gate TG1, a second transfer gate TG2, a first inverter INV1, and a second inverter INV2.

The first transfer gate TG1 may input and output the oscillating signal OSC on the basis of the operation period information INF_T. An input/output operation of the first transfer gate TG1 may be controlled on the basis of the operation period information INF_T and an output signal of the first inverter INV1, which is a signal obtained by inverting the operation period information INF_T. The first transfer gate TG1 may be turned on when the operation period information INF_T has, for example, a logic 'high'. Furthermore, the second transfer gate TG2 may input and output the output signal OUT of the edge generation circuit 210A on the basis of the operation period information INF_T. An input/output operation of the second transfer gate TG2 may be controlled on the basis of the operation period information INF_T and an output signal of the second inverter INV2, which is a signal obtained by inverting the operation period information INF_T. The second transfer gate TG2 may be turned on when the operation period information INF_T has, for example, a logic 'low'.

The signal output circuit 230A may be configured to generate the first pumping driving signal CK_P1 and the second pumping driving signal CK_P2 on the basis of an output signal of the signal selection circuit 220A. In an embodiment, the signal output circuit 230A may include a buffer circuit BF and a third inverter INV3.

The buffer circuit BF may receive the output signal of the signal selection circuit 220A and output the first pumping driving signal CK_P1. The third inverter INV3 may invert the output signal of the signal selection circuit 220A and output the inverted signal as the second pumping driving signal CK_P2.

The internal voltage generation circuit in accordance with an embodiment of the present disclosure is able to select a signal used for generating the first pumping driving signal CK_P1 and the second pumping driving signal CK_P2, on the basis of the operation period information INF_T. That is, the internal voltage generation circuit is able to generate the first pumping driving signal CK_P1 and the second pumping driving signal CK_P2 by using the oscillating signal OSC in the pump period. Furthermore, the internal voltage generation circuit is able to generate the first pumping driving signal CK_P1 and the second pumping driving signal CK_P2 by using the output signal OUT of the edge generation circuit 210A in the maintenance period.

Figure 8:
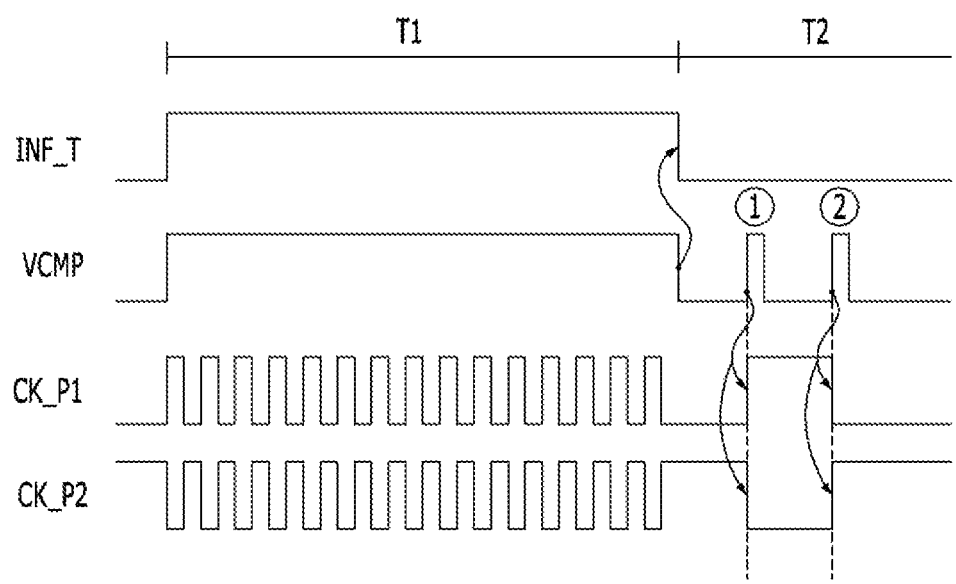
FIG. 8 is a diagram illustrating an overall pumping operation of the internal voltage generation circuit in FIG. 6.

FIG. 8 is a diagram illustrating an overall pumping operation of the internal voltage generation circuit in FIG. 6. FIG. 8 illustrates signal waveforms corresponding to the operation period information INF_T, the comparison signal VCMP, the first pumping driving signal CK_P1, and the second pumping driving signal CK_P2, respectively.

Referring to FIG. 6 to FIG. 8, the operation period information INF_T may have a logic 'high' period on the basis of the enable signal EN and the comparison signal VCMP. The logic 'high' period of the operation period information INF_T may correspond to the pump period T1. In the pump period T1, the first transfer gate TG1 of the signal selection circuit 220A in FIG. 7 may be turned on. That is, the oscillating signal OSC may be outputted to the signal output circuit 230A. Therefore, the signal output circuit 230A may generate the first pumping driving signal CK_P1 and the second pumping driving signal CK_P2 on the basis of the oscillating signal OSC. Subsequently, the pumping circuit 300A in FIG. 6 may generate the pumped voltage V_PMP on the basis of the first pumping driving signal CK_P1 and the second pumping driving signal CK_P2.

Next, in the maintenance period T2, the operation period information INF_T may have a logic 'low'. At this time, the oscillation operation of the oscillation circuit 100A in FIG. 6 may be disabled. Meanwhile, the edge generation circuit 210A in FIG. 7 may sequentially generate an edge, which transitions to a logic 'high', and an edge, which transitions to a logic 'low', in the output signal OUT on the basis of the comparison signal VCMP. Subsequently, in the maintenance period T2, the second transfer gate TG2 of the signal selection circuit 220A in FIG. 7 may be turned on. That is, the output signal OUT of the edge generation circuit 210A may be outputted to the signal output circuit 230A. Therefore, the signal output circuit 230A may generate the first pumping driving signal CK_P1 and the second pumping driving signal CK_P2 on the basis of the output signal OUT of the edge generation circuit 210A. As can be seen from FIG. 8, the first pumping driving signal CK_P1 may include an edge that transitions to a logic 'high' and substantially maintain a logic 'high' on the basis of the comparison signal VCMP enabled at the time point ①. Furthermore, the second pumping driving signal CK_P2 may include an edge that transitions to a logic 'low' and substantially maintain a logic 'low'. Subsequently, the first pumping driving signal CK_P1 may include an edge that transitions to a logic 'low' and substantially maintain a logic 'low' on the basis of the comparison signal VCMP enabled at the time point ②. Furthermore, the second pumping driving signal CK_P2 may include an edge that transitions to a logic 'high' and substantially maintain a logic 'high'. The pumping circuit 300A in FIG. 6 may generate the pumped voltage V_PMP through the unit pumping operation on the basis of the first pumping driving signal CK_P1 and the second pumping driving signal CK_P2.

The internal voltage generation circuit in accordance with an embodiment of the present disclosure is able to control the oscillation operation on the basis of the operation period information INF_T. Furthermore, the internal voltage generation circuit is able to generate the first pumping driving signal CK_P1 and the second pumping driving signal CK_P2 each including an edge formed on the basis of the comparison signal VCMP, and perform the unit pumping operation.

Although various embodiments have been described for illustrative purposes, it will be apparent to those skilled in the art that various changes and modifications may be made without departing from the spirit and scope of the disclosure as defined in the following claims.

What is claimed is:

1. An internal voltage generation circuit comprising:
   an oscillation circuit configured to generate an oscillating signal on the basis of an enable signal;
   a signal generation circuit configured to generate, in a pump period, a first pumping driving signal and a second pumping driving signal to correspond to the oscillating signal, and to generate, in a maintenance period, the first pumping driving signal and the second pumping driving signal to include at least one of a first edge and a second edge of the oscillating signal, and an edge detection signal by detecting the first edge and the second edge of the oscillating signal; and
   a pumping circuit configured to generate a pumped voltage through a pumping operation on the basis of the first pumping driving signal and the second pumping driving signal,
   wherein the signal generation circuit is further configured to transfer the oscillating signal as a first oscillating signal and a second oscillating signal on the basis of the edge detection signal and a comparison signal, and to generate the first pumping driving signal and the second pumping driving signal on the basis of the first oscillating signal and the second oscillating signal.

2. The internal voltage generation circuit according to claim 1, wherein the pumping circuit performs a unit pumping operation including a single pumping operation on the basis of the first pumping driving signal and the second pumping driving signal in the maintenance period.

3. The internal voltage generation circuit according to claim 1, further comprising a comparison circuit configured to generate the comparison signal by comparing a reference voltage corresponding to a target voltage of the pumped voltage with the pumped voltage.

4. The internal voltage generation circuit according to claim 3, wherein the signal generation circuit comprises:
   an edge detection circuit configured to generate the edge detection signal;
   a signal transfer circuit configured to transfer the oscillating signal; and
   a signal output circuit configured to generate the first pumping driving signal and the second pumping driving signal.

5. The internal voltage generation circuit according to claim 4, wherein the signal transfer circuit outputs the oscillating signal as the first oscillating signal and the second oscillating signal in the pump period, and outputs at least one of the first edge and the second edge of the oscillating signal as the first oscillating signal and the second oscillating signal in the maintenance period.

6. The internal voltage generation circuit according to claim 4, wherein the signal output circuit comprises:
   a latch circuit configured to receive the first oscillating signal and the second oscillating signal to perform a latching operation; and
   an output circuit configured to output the first pumping driving signal and the second pumping driving signal on the basis of an output signal of the latch circuit.

7. The internal voltage generation circuit according to claim 6, wherein the latching operation is set based on the first oscillating signal, and is reset based on the second oscillating signal.

8. The internal voltage generation circuit according to claim 6, wherein the edge detection circuit generates the edge detection signal by comparing a logic level of the output signal of the latch circuit with a logic level of the oscillating signal.

9. The internal voltage generation circuit according to claim 1, wherein the pumping circuit comprises:
   a charge/discharge circuit configured to charge and discharge a first charge/discharge node on the basis of the first pumping driving signal, and to charge and discharge a second charge/discharge node on the basis of the second pumping driving signal; and
   a pumping output circuit configured to output charges, stored in the first charge/discharge node, on the basis of the first pumping driving signal, as the pumped voltage, and to output charges, stored in the second charge/discharge node, on the basis of the second pumping driving signal, as the pumped voltage.

10. A method of pumping a voltage, the method comprising:
    generating an oscillating signal, by an oscillation circuit, on the basis of an enable signal;
    generating, by a signal generation circuit in a pump period, a first pumping driving signal and a second pumping driving signal to correspond to the oscillating signal, and generating, in a maintenance period, the first pumping driving signal and the second pumping driving signal to include at least one of a first edge and a second edge of the oscillating signal;
    generating a pumped voltage, by a pumping circuit, through a pumping operation on the basis of the first pumping driving signal and the second pumping driving signal; and
    generating, a comparison signal, by a comparison circuit, by comparing a reference voltage corresponding to a target voltage of the pumped voltage with the pumped voltage,
    wherein the generating of the oscillating signal includes:
    generating the oscillating signal until the pumped voltage reaches a target voltage, and
    generating, after the pumped voltage reaches the target voltage, the oscillating signal that transitions whenever the pumped voltage becomes lower than the target voltage, and wherein the generating the first pumping driving signal and the second pumping driving signal, includes:

generating an edge detection signal, by an edge detecting circuit, which detects the first edge and the second edge of the oscillating signal in the maintenance period;

transferring, by a signal transfer circuit, the oscillating signal as a first oscillating signal and a second oscillating signal on the basis of the edge detection signal and the comparison signal; and generating, by a signal output circuit, the first pumping driving signal and the second pumping driving signal on the basis of the first oscillating signal and the second oscillating signal.

11. An internal voltage generation circuit comprising:

an oscillation circuit configured to generate an oscillating signal on the basis of an enable signal;

a signal generation circuit configured to generate, in a pump period, a first pumping driving signal and a second pumping driving signal to correspond to the oscillating signal, and to generate, in a maintenance period, the first pumping driving signal and the second pumping driving signal to include at least one of a first edge and a second edge of the oscillating signal;

a pumping circuit configured to generate a pumped voltage through a pumping operation on the basis of the first pumping driving signal and the second pumping driving signal; and a comparison circuit configured to generate a comparison signal by comparing a reference voltage corresponding to a target voltage of the pumped voltage with the pumped voltage, wherein the signal generation circuit comprises:

an edge detection circuit configured to generate an edge detection signal by detecting the first edge and the second edge of the oscillating signal in the maintenance period;

a signal transfer circuit configured to transfer the oscillating signal as a first oscillating signal and a second oscillating signal on the basis of the edge detection signal and the comparison signal; and a signal output circuit configured to generate the first pumping driving signal and the second pumping driving signal on the basis of the first oscillating signal and the second oscillating signal.

12. The internal voltage generation circuit according to claim 11, wherein the pumping circuit performs a unit pumping operation including a single pumping operation on the basis of the first pumping driving signal and the second pumping driving signal in the maintenance period.

13. The internal voltage generation circuit according to claim 11, wherein the signal transfer circuit outputs the oscillating signal as the first oscillating signal and the second oscillating signal in the pump period, and outputs at least one of the first edge and the second edge of the oscillating signal as the first oscillating signal and the second oscillating signal in the maintenance period.

14. The internal voltage generation circuit according to claim 11, wherein the signal output circuit comprises:

a latch circuit configured to receive the first oscillating signal and the second oscillating signal to perform a latching operation; and an output circuit configured to output the first pumping driving signal and the second pumping driving signal on the basis of an output signal of the latch circuit.

15. The internal voltage generation circuit according to claim 14, wherein the latching operation is set based on the first oscillating signal, and is reset based on the second oscillating signal.

16. The internal voltage generation circuit according to claim 14, wherein the edge detection circuit generates the edge detection signal by comparing a logic level of the output signal of the latch circuit with a logic level of the oscillating signal.

17. The internal voltage generation circuit according to claim 11, wherein the pumping circuit comprises:

a charge/discharge circuit configured to charge and discharge a first charge/discharge node on the basis of the first pumping driving signal, and to charge and discharge a second charge/discharge node on the basis of the second pumping driving signal; and a pumping output circuit configured to output charges, stored in the first charge/discharge node, on the basis of the first pumping driving signal, as the pumped voltage, and to output charges, stored in the second charge/discharge node, on the basis of the second pumping driving signal, as the pumped voltage.

\* \* \* \* \*